(12) United States Patent
Dobos et al.

(10) Patent No.: US 12,316,210 B2
(45) Date of Patent: May 27, 2025

(54) SWITCH CONTROLLER CIRCUIT AND METHOD FOR CONTROLLING SWITCHING

(71) Applicant: TDK-Lambda UK Limited, Ilfracombe (GB)

(72) Inventors: Leonard Dobos, Ilfracombe (GB); Anthony New, Ilfracombe (GB)

(73) Assignee: TDK-Lambda UK Limited, Ilfracombe (GB)

( * ) Notice: Subject to any disclaimer, the term of this patent is extended or adjusted under 35 U.S.C. 154(b) by 67 days.

(21) Appl. No.: 18/311,400

(22) Filed: May 3, 2023

(65) Prior Publication Data

US 2023/0361670 A1 Nov. 9, 2023

(30) Foreign Application Priority Data

May 5, 2022 (GB) .................................. 2206590

(51) Int. Cl.
*H02M 1/08* (2006.01)
*G01R 15/06* (2006.01)
(Continued)

(52) U.S. Cl.
CPC .............. *H02M 1/08* (2013.01); *G01R 15/06* (2013.01); *H02M 1/38* (2013.01);
(Continued)

(58) Field of Classification Search
None
See application file for complete search history.

(56) References Cited

U.S. PATENT DOCUMENTS

| | | | |
|---|---|---|---|
| 5,572,415 A | | 11/1996 | Mohan |
| 5,764,024 A | * | 6/1998 | Wilson .................... H02P 27/08 318/400.11 |

(Continued)

FOREIGN PATENT DOCUMENTS

| | | |
|---|---|---|
| EP | 0706054 | 4/1996 |
| WO | 2007147725 | 12/2007 |
| WO | 2020123144 | 6/2020 |

OTHER PUBLICATIONS

UK Search Report regarding application No. GB2206590.8, dated Nov. 7, 2022 (4 pgs.).

(Continued)

*Primary Examiner* — Jeffrey S Zweizig
(74) *Attorney, Agent, or Firm* — Walter J. Kawula, Jr.; Hahn Loeser & Parks LLP

(57) ABSTRACT

Switch controller circuit (10) for controlling switching in a topology (1) having a first switch (4), a second switch (5), and a switching node (6) coupled therebetween. A driver arrangement (101,104,105) controls the first and second switches (4,5) to alternately open and close, wherein a deadtime period is applied between the opening of one switch (4) and the closing of the other switch (5) in use. A voltage sensor (106) connected to the switching node (6) provides feedback based on a sensed voltage as it transitions between high and low voltage states and sets a length of the deadtime period based on a measured first time period and a multiplier coefficient. The first time period is measured from a time of opening of one of the switches to a time when the sensed voltage transitions through a threshold set between the high and low voltage states.

18 Claims, 4 Drawing Sheets

(51) Int. Cl.
*H02M 1/38* (2007.01)
*H03K 17/687* (2006.01)

(52) U.S. Cl.
CPC . *H03K 17/6871* (2013.01); *H03K 2217/0063* (2013.01); *H03K 2217/0072* (2013.01)

(56) References Cited

U.S. PATENT DOCUMENTS

| | | | |
|---|---|---|---|
| 7,782,037 B2 * | 8/2010 | Ohtani | H02M 1/38 323/284 |
| 10,666,152 B2 * | 5/2020 | Jun | H02M 3/3353 |
| 11,881,771 B2 * | 1/2024 | Fan | H02M 3/155 |
| 2005/0184714 A1 | 8/2005 | Rusu et al. | |
| 2019/0058450 A1 | 2/2019 | Jun et al. | |

OTHER PUBLICATIONS

UK Search Report regarding GB2206590.8, dated Jul. 17, 2023 (2 pgs.).
EPO Patent Office machine translation of specification for EP0706054, dated Oct. 16, 2023 (26 pgs.).
EPO Patent Office machine translation of claims for EP0706054, dated Oct. 16, 2023 (5 pgs.).

* cited by examiner

SWITCH CONTROLLER CIRCUIT AND METHOD FOR CONTROLLING SWITCHING

INTRODUCTION

The present disclosure relates to a switch controller circuit for controlling switching in a switching topology and, in particular, a half or full bridge topology. The present disclosure is particularly relevant to an adaptive deadtime switch controller for driving half-bridge and full bridge topologies in power electronics applications, and a switch mode power supply controller. The disclosure also concerns a method of controlling switching, and a power supply incorporating the switch controller.

BACKGROUND

FIG. 1 shows a half-bridge topology 1 commonly used in DC-AC inverters and DC-DC converter applications. In the topology, two MOSFET switch devices 4,5 are connected in series, with the devices being driven by two complementary driving signals applied to their respective gates 41,51, each with a duty cycle which may be approximately 50%. To maintain operation and improve efficiency, it is desirable for such switching devices in a switch mode power supply to soft-switch so that their power dissipation during the switching operation is zero. As such, when MOSFET switch devices 4,5 are turned on or off, the voltage and current flow across them ideally needs to be zero. To facilitate this, an amount of deadtime is provided between opening one switch and closing the other.

FIG. 2 is a schematic graph showing a signal driving the high side switch device HS1 (4 in FIG. 1) and the signal driving the low side switch device LS1 (5 in FIG. 1), as well as the switching node signal SN1 (output 6 in FIG. 1). In FIG. 2, the deadtime is shown in the greyed area 8, and is the amount of time when both switch devices 4,5 are off and the signals driving these devices are maintained low. As shown, when HS1 is turned low at point 7, while LS1 is kept low, the SN1 signal undergoes a falling transition from its high voltage state. Improved efficiency is achieved provided LS1 isn't turned on (low voltage point 9 in FIG. 2) until after the drain-source voltage (VDS) of the SN1 signal has dropped to its low state, with this being at zero volts, or close thereto. Consequently, the setting of the deadtime period 8 is important to achieving efficient operation.

In this respect, conventionally, controllers for driving switches in half bridge topologies will apply a fixed value of dead time. However, the time taken for the falling transition of the SN1 signal can vary in certain operating conditions. In these scenarios, efficiency is lost when the fixed deadtime is too short or too long. For instance, FIG. 3 shows a scenario where the deadtime setting is too short, resulting in hard switching and consequently power dissipation in the device. In practice, this hard switching will also affect the gate signals which will present the Miller Plateaux. FIG. 4 conversely shows a scenario where the deadtime setting is too long. Here, after the initial SN1 voltage drop, the resonant current passes through zero and starts to pull the voltage back up again. This again causes hard switching and power dissipation, and hence reduces efficiency and increases the chance of component damage.

To address the above problem, more sophisticated controllers attempt to apply a variable length of deadtime based on monitoring when the switching node signal SN1 has reached its low voltage state (i.e. a zero voltage or a value close to zero). As such, the instant of time when the switching node voltage transition reaches a minimum threshold value is used to dictate the end of the deadtime period. Aside from a small monitoring delay, this approach generally works well provided the power switches have a near-constant drain capacitance between the ON state and OFF state, and hence exhibit a linear SN1 voltage transition like that shown in FIG. 5. However, in practice, power switches that have a near-constant drain capacitance are rare.

In this connection, in most modern power devices, like MOSFETs with silicon super-junction technology, the drain capacitance could vary by two orders of magnitude between the ON and OFF states (e.g. from pico-Farad to nano-Farad). In this situation, the SN1 voltage transition presents three slopes, as shown in FIG. 6. Consequently, detecting when the switching node voltage has reached its low voltage state is extremely difficult. Other technologies, such as silicon carbide and GAN may have a smaller change in capacitance but still present the same problem. As such, the low side switch device LS1 may be turned on prematurely, resulting in the device dissipating the energy stored in the parasitic capacitances 42,52. Furthermore, in noisy environments, such as in a power supply, it can also be difficult to detect the true low voltage state (e.g. 0V). Accordingly, even with more advanced conventional controllers, hard switching can still occur.

It will be understood that, although a half-bridge topology 1 is described above, the above deadtime issues also equally applies to a full-bridge topology, as well as other switching topologies.

There is therefore a need for an improved adaptive deadtime controller circuit and control method for power electronics devices.

SUMMARY

According to a first aspect, there is provided a switch controller circuit for controlling switching in a topology having a first switch, a second switch, and a switching node coupled therebetween, wherein the controller circuit comprises: a driver arrangement for controlling the first and second switches to alternately open and close, wherein a deadtime period is applied between the opening of one switch and the closing of the other switch in use; a voltage sensor for connection to the switching node for providing feedback based on a sensed voltage as it transitions between high and low voltage states during the deadtime period; and wherein the controller is configured to set a length of the deadtime period based on a measured first time period and a multiplier coefficient, wherein the first time period is measured from a time of opening of one of the switches to a time when the sensed voltage transitions through a threshold set between the high and low voltage states.

In this way, the switch controller circuit may vary the amount of deadtime to achieve optimised soft switching, and hence improved efficiency and reduced losses. That is, the controller determines the amount of deadtime based on a threshold point during the high-to-low voltage transition. The faster slope variation during this period means that the detection of the instant of time where the threshold is passed may be more accurately determined, as compared to detecting when a low voltage state is achieved. Importantly, even if the length of the measured period varies with varying switching loads, the applied deadtime will also be adjusted to thereby maintain optimal operation.

In embodiments, the first switch is a high side switch and the second switch is a low side switch.

In embodiments, the threshold is a mid-point voltage between the high and low voltage states. In this way, the threshold is set during the steepest slope transition, thereby improving detection accuracy.

In embodiments, the threshold is a voltage half the voltage at the high voltage state. In this way, where the high and low side switch devices present a symmetrical transition, a straightforward calculation of the total required deadtime may be implemented by simply doubling the first time period.

In embodiments, the multiplier coefficient is between 1.5 and 5. In preferred embodiments, the multiplier coefficient is between 1.5 and 2.5.

In embodiments, the multiplier coefficient is 2.

In embodiments, the driver arrangement comprises a high side driver for driving the first switch and a low side driver for driving the second switch.

In embodiments, the switch controller circuit further comprises a processor for controlling the driver arrangement and setting the length of the deadtime period, wherein the processor measures the first time period from the time of opening of one of the switches to the time when the sensed voltage transitions through the threshold based on feedback from the voltage sensor. In this way, the processor may be configured to implement a deadtime algorithm for varying the applied deadtime. In embodiments, the deadtime algorithm may be implemented in software running on the processor.

In embodiments, the voltage sensor comprises a reactive divider. In this way, a pre-set transition threshold level may be applied using passive components, even in the event of variations in the voltage supply, which may occur during holdup, or during supply voltage changes or ripple in a rectified AC supply.

In embodiments, the voltage sensor further comprises a bias circuit, wherein the bias circuit supplies a bias voltage. In embodiments, the bias voltage corresponds to the high voltage state. In other embodiments, the bias voltage corresponds to an auxiliary voltage. The auxiliary voltage may be used to power the controller as well.

In embodiments, the bias circuit further comprises first and second resistors in a voltage divider arrangement for dividing the bias voltage. In this way, the trigger threshold may be conveniently set based on the ratio between the first and second resistors, which thereby allows a consistent sense point to be maintained. In embodiments, the bias voltage may be provided from a low-voltage supply, such as the controller voltage.

In embodiments, the voltage sensor comprises an output and is configured to generate a feedback signal on the output when the switching node voltage transitions through the threshold. In this way, the signal may be used to trigger the detection event in the controller processor or integrated circuit.

In embodiments, the topology is a half bridge, full bridge, or three phase topology. In embodiments, the topology uses two low-side switches, or two high-side switches. In this case the switching node measured could be one or other of the device drains. In embodiments, the topology comprises a resonant push-pull converter, two low-side switches, and a centre-tapped transformer/inductor.

According to a second aspect, there is provided a method for controlling switching in a topology having a first switch, a second switch, and a switching node coupled therebetween, wherein the method comprises: controlling the first and second switches to alternately open and close using a driver arrangement, wherein a deadtime period is applied between the opening of one switch and the closing of the other switch; receiving feedback based on a sensed voltage by a voltage sensor connected to the switching node as it transitions between high and low voltage states during the deadtime period; and setting a length of the deadtime period based on a measured first time period and a multiplier coefficient, wherein the first time period is measured from a time of opening of one of the switches to a time when the sensed voltage transitions through a threshold set between the high and low voltage states.

In embodiments, the first switch is a high side switch and the second switch is a low side switch.

In embodiments, the threshold is a voltage half the voltage at the high voltage state.

In embodiments, the multiplier coefficient is between 1.5 and 5. In preferred embodiments, the multiplier coefficient is between 1.5 and 2.5. In embodiments, the multiplier coefficient is 2.

According to a third aspect, there is provided a voltage sensor for providing feedback based on a sensed node voltage which varies between high and low voltage states, the voltage sensor comprising: a reactive divider; a bias circuit for supplying a bias voltage and comprising first and second resistors in a voltage divider arrangement for dividing the bias voltage to set a threshold; and an output for a feedback signal, wherein the voltage sensor is configured to generate the feedback signal on the output when the node voltage transitions through the threshold. In embodiments, the bias voltage corresponds to the high voltage state. In other embodiments, the bias voltage corresponds to an auxiliary voltage. The auxiliary voltage may be used to power the controller as well.

In embodiments, there is a time delay between the controller exerting the gate drive state change and the gate voltage of the device actually passing the on/off transition point. This time delay in the gate drive circuit and/or device may be different between the high-side and low-side drivers, and may be different in the turn-on delay and turn-off delay. These delays may be a significant fraction of the delay time measured. If the sensed crossing of the threshold is compared with the transitions of the controller command (instead of the actual gate voltages of the switching device) these delays must be added to or subtracted from the measured delay when the multiplier is calculated. The driver time delays may be constant or vary predictably, making the calculation easy.

BRIEF DESCRIPTION OF DRAWINGS

Illustrative embodiments will now be described with reference to the accompanying drawings in which.

DETAILED DESCRIPTION

Figure 7:
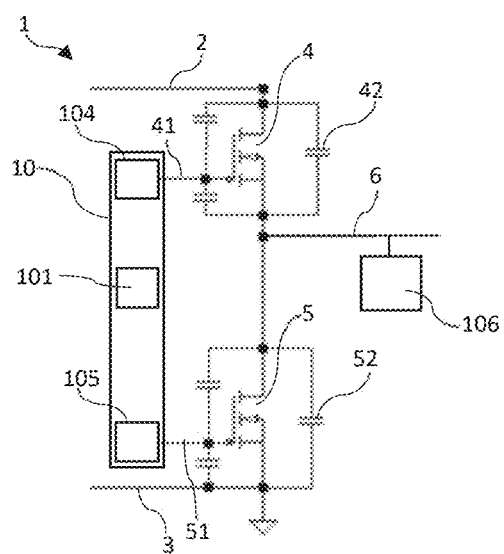
FIG. 7 shows an illustrative half-bridge topology incorporating a controller according to an embodiment of the invention.

A controller 10 according to an illustrative embodiment of the invention is shown in FIG. 7. The controller 10 is incorporated into a half-bridge topology 1.

Figure 1:
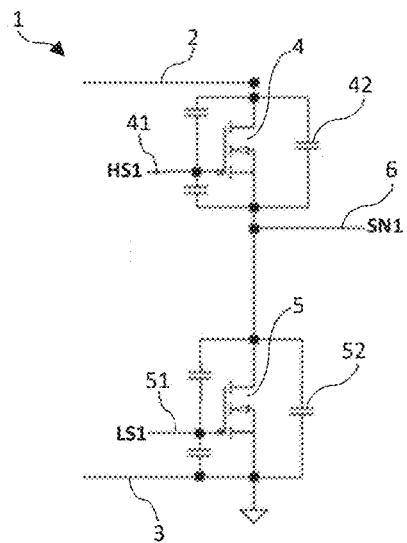
FIG. 1 shows an illustrative half-bridge topology.
Figure 2:
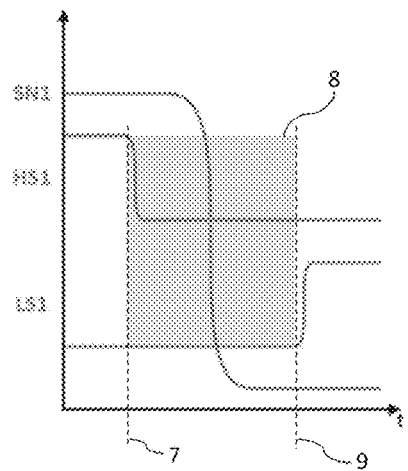
FIG. 2 is a schematic graph showing the HS1, LS1, and SN1 signal voltages over a switching transition where the deadtime is optimal.
Figure 3:
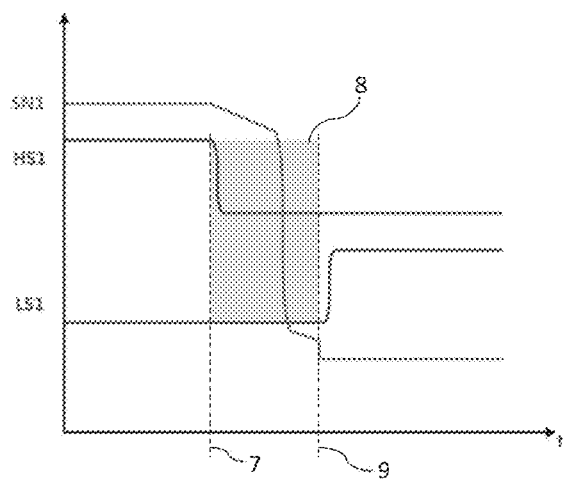
FIG. 3 is a schematic graph showing the HS1, LS1, and SN1 signal voltages over a switching transition where the deadtime is too short.
Figure 4:
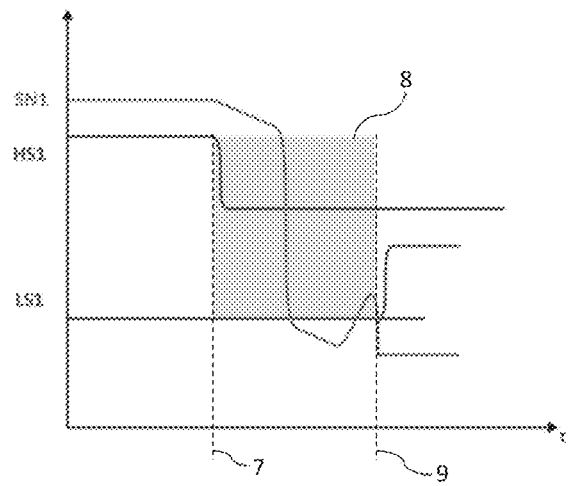
FIG. 4 is a schematic graph showing the HS1, LS1, and SN1 signal voltages over a switching transition where the deadtime is too long.
Figure 5:
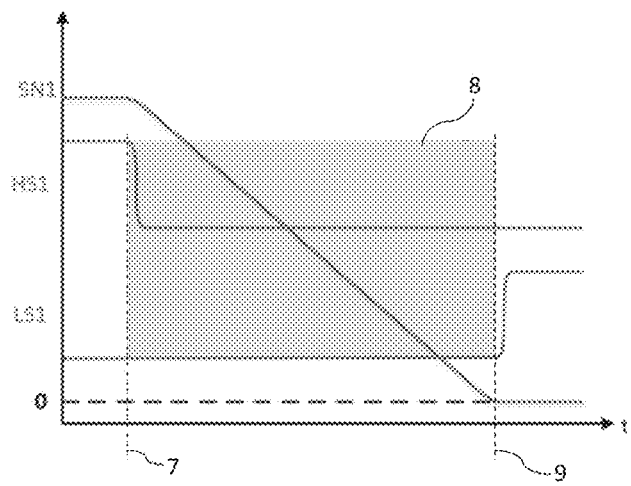
FIG. 5 is a schematic graph showing the HS1, LS1, and SN1 signal voltages over a switching transition where there is a near-constant drain capacitance between the ON and OFF states.
Figure 6:
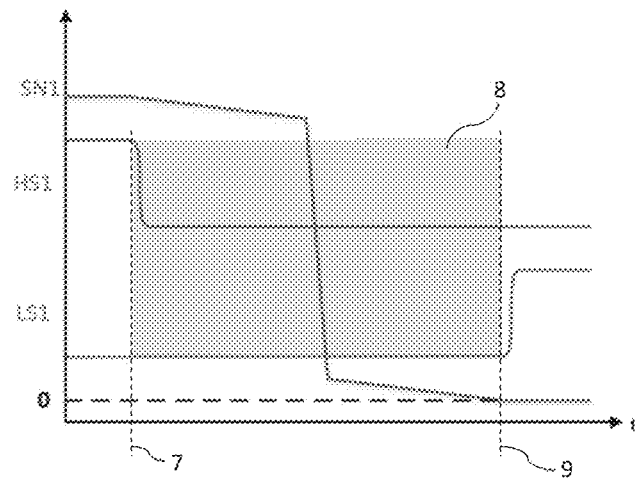
FIG. 6 is a schematic graph showing the HS1, LS1, and SN1 signal voltages over a switching transition where the drain capacitance varies between the ON and OFF states.

As with the arrangement shown in FIG. 1, the high side switch device 4 and low side switch device 5 are connected in series between positive line 2 and ground line 3. Parasitic capacitors 42,52 are associated with each of the switch devices 4,5.

The controller 10 in this embodiment includes a processor 101 for implementing control algorithm software for determining an optimal amount of dead time. In other embodiments, the controller 10 may be provided as a fully integrated solution implemented in an integrated circuit. Such an integrated solution may incorporate the voltage sensor 106. The controller 10 includes a high side control driver 104 and a low side control driver 105 for driving the high and low side switch devices 4,5 through the high and low side gate inputs 41,51, respectively.

The controller 10 further includes a voltage sensor 106 provided on the output switching node line 6 for sensing the switching node voltage. The controller 10 provides adaptive deadtime based on the sensed voltage of the switching node voltage transition.

The controller 10 is configured to detect the time for the switching node voltage to transition from a high to mid-point. In this embodiment, the mid-point is when the voltage on the switching node line 6 crosses a threshold corresponding to approximately half of the high voltage state, +Vin, applied on the positive line 2. Accordingly, the controller 10 identifies a start time as the instant of time when the high side or low side switch device 4,5 is turned off, and identifies a stop time as the instant of time when the switching node voltage matches half of the applied voltage. This time difference between the start and stop times is then used as the basis for calculating the value of deadtime to be set for optimal operation, as is explained further below with reference to FIG. 8.

Figure 8:
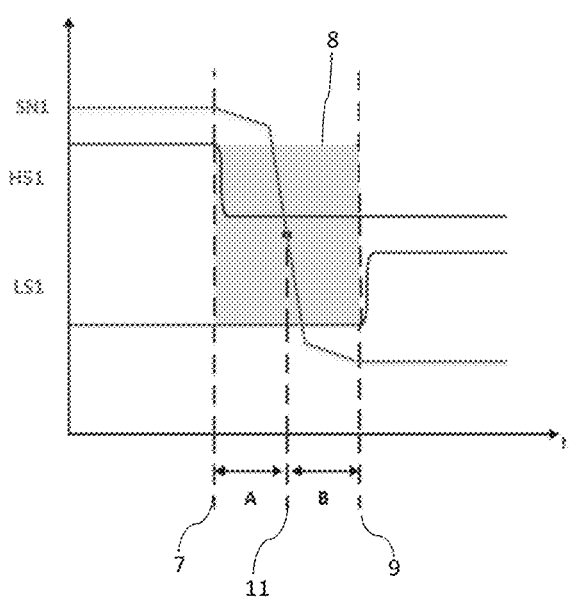
FIG. 8 is a schematic graph showing the HS1, LS1, and SN1 signal voltages over a switching transition where the deadtime is controlled by the controller shown in FIG. 7.

In this connection, FIG. 8 shows a schematic graph of the HS1, LS1, and SN1 signal voltages over a switching transition where the deadtime is controlled by the controller shown in FIG. 7. As discussed above, the controller 10 monitors the switching node voltage transition SN1 and measures the time between the HS1 signal being turned off, and the mid-voltage point 11. This time period is identified as interval A in FIG. 8. The controller 10 then determines the amount of deadtime required by calculating a time period for interval B corresponding to the time between the mid-voltage point 11 and the low voltage point 9. This determination is based on an algorithmic relationship between the intervals A and B. In this connection, when the high side and the low side switch devices 4,5 are the same, they can be expected to present a symmetrical transition. As such, intervals A and B will be substantially the same and therefore the total deadtime may be calculated as two times interval A. Accordingly the deadtime calculation algorithm in this embodiment may be expressed as:

$$\text{Deadtime} = A + B = 2 \cdot A$$

It will be understood that in other embodiments, a different multiplier coefficient might be required if the two devices are different or if the trigger threshold is set to a different level relative to +Vin.

As will be understood, the controller 10 allows the applied deadtime to vary with changing load conditions. For example, in modern switching devices, the transition time at high loads will be relatively short. For instance, if the time period A from the high to mid-point transition is measured to be around 100 ns, the "2·A" algorithm applied by the controller 10 will result in a total deadtime of 200 ns. Conversely, a longer transition time would be associated with lower loads. For instance, if the time period A from the high to mid-point transition is measured to be around 500 ns, the controller 10 will result in a total deadtime applied of 1 µs.

Accordingly, the adaptive deadtime control provided by the controller 10 provides a new way to determine the amount of deadtime required to drive half bridge or full bridge switching devices for improving efficiency and reducing losses. Importantly, as the transition at the mid-point between the high and low voltage states presents a faster slope variation, the detection of the instant of time of such a transition may be more accurate, compared to detecting the low voltage point 9 of the switching node voltage. As such, a more precise deadtime value may be applied for maintaining the switching devices off until the optimum moment. This thereby improves efficiency and reduces losses in the switching devices, at both light and heavy loads.

Controllers according to the above may be particularly useful in super-junction switching devices which have a high variation of parasitic capacitance between the on and off conditions. Embodiments may also be incorporated into power supply devices, such as DC-DC converters, for driving half and/or full bridges within those devices. Embodiments may also be incorporated into other topologies, such as resonant or semi-resonant converters which do not use half or full bridges, such as push-pull converters using two low-side devices that switch alternately.

Figure 9:
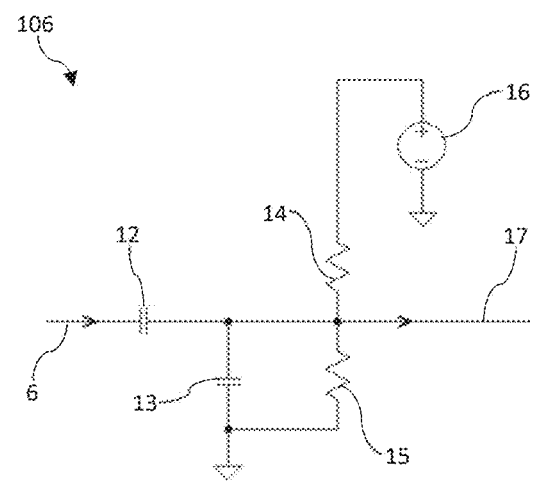
FIG. 9 shows a reactive divider for use in a controller according to a further embodiment of the invention.

A further inventive aspect will now be described with reference to FIG. 9. In particular, FIG. 9 shows a voltage sensor 106 according to an illustrative embodiment, with the voltage sensor 106 being used in the controller arrangement described above in FIG. 7. However, it will be understood that the voltage sensor may also be used in other arrangements. For example, the voltage sensor may be used to sense a high voltage AC signal for feedback in other control and protection systems, or could be used with comparators with internal references. Equally, it will also be understood that other voltage sensors may be used in the above controller arrangement.

In this embodiment, the voltage sensor 106 functions as a reactive divider for monitoring the switching node voltage in a half or full bridge topology. Based on this, a low voltage output signal is output to the controller 10 for use in setting the amount of deadtime needed between the switch driving signals. Advantageously, the arrangement shown in FIG. 9 provides for the detection of a transition threshold which varies with the maximum voltage value, in this case being 50% of the maximum voltage (i.e. a 50% threshold). This contrasts with conventional voltage sensors, such as resistive dividers or MOS devices with integrated solutions, that merely provide an attenuated low voltage sensor signal.

As shown in FIG. 9, the voltage sensor 106 is connected to the switching node line SN1 6 and comprises passive components arranged as a reactive divider circuit in parallel with a DC bias circuit.

The reactive divider circuit, fed by switching node line SN1 6, includes first and second capacitors 12,13 and feeds a sensor output 17. In this embodiment, the DC bias circuit is fed by the same DC voltage supply 16 supplying the topology shown in FIG. 7. In other embodiments, the DC bias circuit may be fed by a different power supply, such as a low voltage one (e.g. 3.3V). The supply 16 feeds through a resistive divider arrangement comprising a first and second resistor 14,15, with their relative resistance values setting a desired offset applied to the sensor output 17, which sets the event trigger threshold.

In this connection, in this embodiment, the trigger threshold is 50% of the high voltage signal and hence the first and second resistors can have the same resistance values. The reactive divider will attenuate the high voltage AC signal, while the DC bias will set the 50% transition at the same threshold of the controller. For example if the AC transition is 0-400V, and the controller can detect the transition at 1.65V (range 0-3.3V). The reactive divider could be used to reduce the AC voltage in the range 0-2V for example, while the bias circuit and resistors divider will fix the variation around 1.65V+−1V, or 1.3V+−1V depending of the ratio. The voltage applied by DC supply 16 corresponds to an auxiliary power supply, such as 3.3V, and the offset may be set at the value threshold detectable by the controller, such as half of the auxiliary power supply (e.g. 1.65V) or different (e.g. 1.3V). Consequently, as the maximum voltage changes in absolute terms, the threshold remains 50% of this.

In use, the voltage sensor arrangement extracts the AC signal content from the high voltage signal on switching node line SN1 6 signal and outputs a signal through sensor output line 17 when the signal voltage drops below the threshold. That is, when the attenuated AC signal, drops below the DC bias applied by the DC bias circuit, the output is fed to the microprocessor 101. Accordingly, the capacitive divider reduces the voltage swing at the switching node to a level that is suitable for the controller input (less than 5V). The AC coupling of capacitor 12 allows the threshold voltage of the controller input to be adjusted independently of the threshold voltage of the switching node, even if one or other of these varies. This is then used by the microprocessor 101 to set the amount of deadtime needed between the switch driving signals.

Some embodiments of the voltage sensor may also include a protection circuit for protecting the integrity of the signal and a filtering circuit for filtering the signals.

It will be understood that the embodiment described above shows an application only for the purposes of illustration. In practice, embodiments may be applied to many different configurations, the detailed embodiments being straightforward for those skilled in the art to implement.

For example, in embodiments, the controller 10 may be configured so that the applied deadtime is within a range having a predetermined minimum and/or maximum deadtime.

Furthermore, for example, although a half bridge topology has been described above it will be understood that the invention may also be applied to other topologies. For example, in alternative embodiments, the topology may comprise a resonant push-pull converter, two low-side switches, and a centre-tapped transformer/inductor.

The invention claimed is:

1. A switch controller circuit for controlling switching in a topology having a first switch, a second switch, and a switching node coupled therebetween, wherein the controller circuit comprises:
   a driver arrangement for controlling the first and second switches to alternately open and close, wherein a deadtime period is applied between the opening of one switch and the closing of the other switch in use;
   a voltage sensor for connection to the switching node for providing feedback based on a sensed voltage as it transitions between high and low voltage states during the deadtime period; and
   wherein the controller is configured to set a length of the deadtime period based on a measured first time period and a multiplier coefficient, wherein the first time period is measured from a time of opening of one of the switches to a time when the sensed voltage transitions through a threshold set between the high and low voltage states;
   wherein the first time period has an algorithmic relationship with a second time period, the second time period being a time between the sensed voltage transitioning through the threshold and the time of closing of the other switch; and
   wherein the multiplier coefficient is selected such that the deadtime period is the sum of the first time period and the second time period.

2. A switch controller circuit according to claim 1, wherein the threshold is a mid-point voltage between the high and low voltage states.

3. A switch controller circuit according to claim 1, wherein the threshold is a voltage half the voltage at the high voltage state.

4. A switch controller circuit according to claim 1, wherein the multiplier coefficient is between 1 and 5.

5. A switch controller circuit according to claim 4, wherein the multiplier coefficient is 2.

6. A switch controller circuit according to claim 1, wherein the driver arrangement comprises a high side driver for driving the high side switch and a low side driver for driving the low side switch.

7. A switch controller circuit according to claim 1, further comprising a processor for controlling the driver arrangement and setting the length of the deadtime period, wherein the processor measures the first time period from the time of opening of one of the switches to the time when the sensed voltage transitions through the threshold based on feedback from the voltage sensor.

8. A switch controller circuit according to claim 1, wherein the voltage sensor comprises a reactive divider.

9. A switch controller circuit according to claim 8, wherein the voltage sensor further comprises a bias circuit, wherein the bias circuit supplies a bias voltage corresponding to the detectable threshold of the controller.

10. A switch controller circuit according to claim 9, wherein the bias circuit further comprises first and second resistors in a voltage divider arrangement for dividing the bias voltage.

11. A switch controller circuit according to claim 1, wherein the voltage sensor comprises an output and is configured to generate a feedback signal on the output when the switching node voltage transitions through the threshold.

12. A switch controller circuit according to claim 1, wherein the topology is a half bridge, full bridge, or three phase topology.

13. A method for controlling switching in a topology having a first switch, a second switch, and a switching node coupled therebetween, wherein the method comprises:
controlling the first and second switches to alternately open and close using a driver arrangement, wherein a deadtime period is applied between the opening of one switch and the closing of the other switch;
receiving feedback based on a sensed voltage by a voltage sensor connected to the switching node as it transitions between high and low voltage states during the deadtime period; and
setting a length of the deadtime period based on a measured first time period and a multiplier coefficient, wherein the first time period is measured from a time of opening of one of the switches to a time when the sensed voltage transitions through a threshold set between the high and low voltage states;
wherein the first time period has an algorithmic relationship with a second time period, the second time period being a time between the sensed voltage transitioning through the threshold and the time of closing of the other switch; and
wherein the multiplier coefficient is selected such that the deadtime period is equal to sum of the first time period and the second time period.

14. A method according to claim 13, wherein the threshold is a voltage half the voltage at the high voltage state.

15. A method according to claim 13, wherein the multiplier coefficient is 2.

16. A method according to claim 13 where the driver delays are added or subtracted before or after the multiplier coefficient is applied.

17. A method according to claim 13, wherein the topology is a half bridge, full bridge, or three phase topology.

18. A voltage sensor for providing feedback based on a sensed node voltage which varies between high and low voltage states, the voltage sensor comprising:
an AC reactive divider;
a DC bias circuit in parallel with the reactive divider for supplying a bias voltage corresponding to the high voltage state and comprising first and second resistors in a voltage divider arrangement for dividing the bias voltage to set a threshold; and
an output for a feedback signal,
wherein the voltage sensor is configured to generate the feedback signal on the output when the node voltage transitions through the threshold.

* * * * *